United States Patent [19]
Sano et al.

[11] Patent Number: 5,884,154
[45] Date of Patent: Mar. 16, 1999

[54] LOW NOISE MIXER CIRCUIT HAVING PASSIVE INDUCTOR ELEMENTS

[75] Inventors: Jun-ichi Sano, Chelmsford, Mass.; Raymond S. Pengelly, Windham, N.H.; Miles E. Goff, Carlisle, Mass.

[73] Assignee: Raytheon Company, Lexington, Mass.

[21] Appl. No.: 672,486

[22] Filed: Jun. 26, 1996

[51] Int. Cl.⁶ .............................. H04B 1/28; H04B 1/16
[52] U.S. Cl. ................... 455/333; 455/326; 333/132; 333/100; 327/113
[58] Field of Search ..................... 455/333, 326, 455/325; 333/132, 133, 100; 327/355, 356, 113

[56] References Cited

U.S. PATENT DOCUMENTS

| | | | |
|---|---|---|---|
| 4,931,746 | 6/1990 | Trankle et al. | 455/333 |
| 5,379,457 | 1/1995 | Nguyen | 455/323 |
| 5,559,457 | 9/1996 | Uda et al. | 327/355 |
| 5,563,545 | 10/1996 | Scheinberg | 327/389 |
| 5,570,056 | 10/1996 | Groe | 327/359 |
| 5,589,791 | 12/1996 | Gilbert | 327/359 |
| 5,675,392 | 10/1997 | Nayebi et al. | 348/584 |

OTHER PUBLICATIONS

Gilbert, B. A Precise Four–Quadrant Multiplier with Sub-nanosecond Response', IEEE Journal of Solid–State Circuits, Dec. 1968, vol. SC–3, pp. 250–256.

Grebene, A. "Bipolar and MOS Analog Integrated Circuit Design", John Wiley & Sons, 1984, pp. 469–479.

*Primary Examiner*—Tommy P. Chin
*Assistant Examiner*—Anand S. Rao
*Attorney, Agent, or Firm*—Cesari and McKenna, LLP

[57] ABSTRACT

A mixer circuit is provided which incorporates inductive elements for low voltage applications. The circuit consists of a balanced amplifier and a switch composed of transistor pairs driven by a local oscillator signal for multiplying the signal to produce a circuit output signal having a predetermined intermediate frequency. Inductors are used to provide degenerative feedback in the balanced amplifier portion of the circuit. The inductors generate negligible noise and produce a negligible dc voltage drop. The transistors in the circuit are thereby maintained in saturation regions of operation as desired. In accordance with another aspect of the invention, an inductor or, alternatively, a parallel inductor-capacitor circuit, is used as a constant current source in conjunction with the input transistors in the balanced amplifier portion of the circuit.

8 Claims, 3 Drawing Sheets

LOW NOISE MIXER CIRCUIT HAVING PASSIVE INDUCTOR ELEMENTS

BACKGROUND OF THE INVENTION

A. Field of the Invention

This invention relates to microwave mixer circuits which incorporate passive inductive elements as negative feedback components to provide noise reduction and a wide dynamic range for the mixer. More specifically, the present invention uses degenerative inductors in conjunction with the input transistors to maintain linearity of the circuit while reducing problems due to low voltage and thermal noise as discussed hereinafter. In a balanced configuration, the mixer may also include an inductor or a parallel inductor-capacitor resonant circuit to act as a constant current source at RF frequencies to maintain symmetry of the signal from the input stage.

B. Description of Related Art

Various forms of signal multipliers have been known for processing of signals in a wide variety of applications, e.g. mixer and modulator circuits. A two-signal four-quadrant multiplier commonly known as a "Gilbert cell mixer" was described by Gilbert, *A Precise Four-Quadrant Multiplier with Subnanosecond Response*, IEEE Journal of Solid-State Circuits, Vol. SC-3, pp. 365–373 (Dec. 1968). As described in more detail herein, these circuits typically are composed of two pairs of switching transistors which are cross connected, and which switch the outputs of a further pair of signal input transistors, connected as a balanced amplifier. Mixers using Gilbert cell structures have the advantage of high isolation and positive conversion gain due to the balanced structure of the differential amplifier configuration.

In the conventional Gilbert mixer, degenerative resistive feedback is used with the input transistors to enhance the linearity of the input stage. It has been conventional to use resistors in the circuit, in part, because resistors occupy a smaller area on the integrated circuit than other components may occupy. However, the degenerative resistors generate thermal noise which can substantially degrade the noise figure of the mixer. In addition, the dc voltage drop across the resistors reduces the effective power supply voltage for the transistors in the mixer. This can be offset by an increase in the output voltage of the power source, but such an increase is costly to obtain in battery-powered units. In such cases, the input voltage must be unduly constrained in order to maintain operation of the input transistors in their linear regions. The low voltage can also degrade the operation of the switching transistors.

Another feature of the balanced mixer circuit is the use of a constant current source to maintain a constant total current through the two input transistors. This maintains symmetry in the outputs of these transistors. In the conventional mixer, the constant current source is typically a transistor. The resulting circuit configuration is a three-level stack of transistors. The problem with such a design is that the voltage drop across the constant current source reduces the supply voltage available for the input and switching stages. Again, this is a problem when a lowvoltage power supply is desired.

Other types of modulating circuits for various applications have been known. These applications include modulator-type circuits for generation of amplitude-modulated signals. In addition to AM signal generation, these circuits can be used for automatic gain control, frequency multiplication, phase detection, synchronous AM or FM demodulation, and frequency discrimination. Balanced modulators in general were described in Grebene, *Bipolar and MOS Analog Integrated Circuit Design*, John Wiley & Sons, pages 469–79 (1984).

None of the aforementioned prior circuits adequately maintain a wide operating range at low power supply voltages. There remains a need, therefore, for a circuit which has a wide operating range even in the presence of a low supply voltage, such as 3.6 volts or lower, and which circuit includes degenerative feedback providing increased linearity of the circuit. Furthermore, there remains a need for a circuit which has a constant current source but which current source does not promote a further drop in the available voltage swing for the input transistors and the switching transistors of the circuit.

Accordingly, it is an object of the present invention to provide a circuit which has a wide dynamic range at low power supply voltages, for example. It is a further object of the invention to use degenerative elements which improve the linearity of the circuit but do not add to a substantial dc voltage drop, thus decreasing the obtainable voltage swing across the transistors of the circuit. It is also an object of the invention to do so with the addition of minimum noise as a low-noise requirement is particularly important in the processing of comparatively weak microwave signals.

It is yet another object of the invention to provide the input transistors with a constant current source which has a negligible dc voltage drop across it. Yet another object of the invention is to meet these needs while allowing for convenient adaptability within microwave integrated circuits and remaining within the space limitations encountered in such integrated circuit technology.

DESCRIPTION OF THE INVENTION

BRIEF SUMMARY OF THE INVENTION

A balanced mixer incorporating the present invention uses an inductor as a degenerative impedance element, and also an inductive constant current source if desired. The mixer includes a balanced input amplifier composed of two input transistors which receive a microwave input signal from an outside source such as an antenna. It also includes a set of transistor pairs which operate as switches which are driven by a local oscillator signal. The output of the balanced amplifier is applied to the switching transistor pairs, and as the switches turn on and off, the signal is periodically inverted and thus multiplied by a square wave at the frequency of the local oscillator. This converts the input signal to the desired intermediate frequency.

In accordance with the present invention, inductors are connected to the input transistors to operate as feedback impedances instead of the resistors that are conventionally used for that purpose. Thus, the inductors improve the linearity of the circuit. However, unlike resistors, they have essentially no dc voltage drop, so the full supply voltage is applied to the transistors and the load resistors of the mixer. The input transistors will thus operate linearly and the switching transistors will operate as switches, as desired, even with relatively low supply voltages. Further, there is negligible thermal noise generated by the inductor as compared with the resistors previously used as feedback elements.

In accordance with another aspect of the invention an inductor or, alternatively, a parallel inductor-capacitor resonant circuit is used instead of the conventional transistor as a constant current source in the circuit. This avoids the dc voltage drop which occurs across the conventionally-used transistor and which, again, may result in the gate-source voltage of the input transistors being too low to maintain linearity and the switching transistors operating such that a switching function is not performed.

The invention is particularly useful for low supply-voltage technology used for portable radio transmitter/receiver circuits such as, for example, up/down converter circuits of wireless telephones. In addition, the invention is applicable to direct satellite television receiver circuits.

BRIEF DESCRIPTION OF THE DRAWINGS

For a fuller understanding of the nature of the invention, reference should be had to the following detailed description taken in connection with the accompanying drawings, in which.

DETAILED DESCRIPTION OF THE INVENTION

Figure 1:
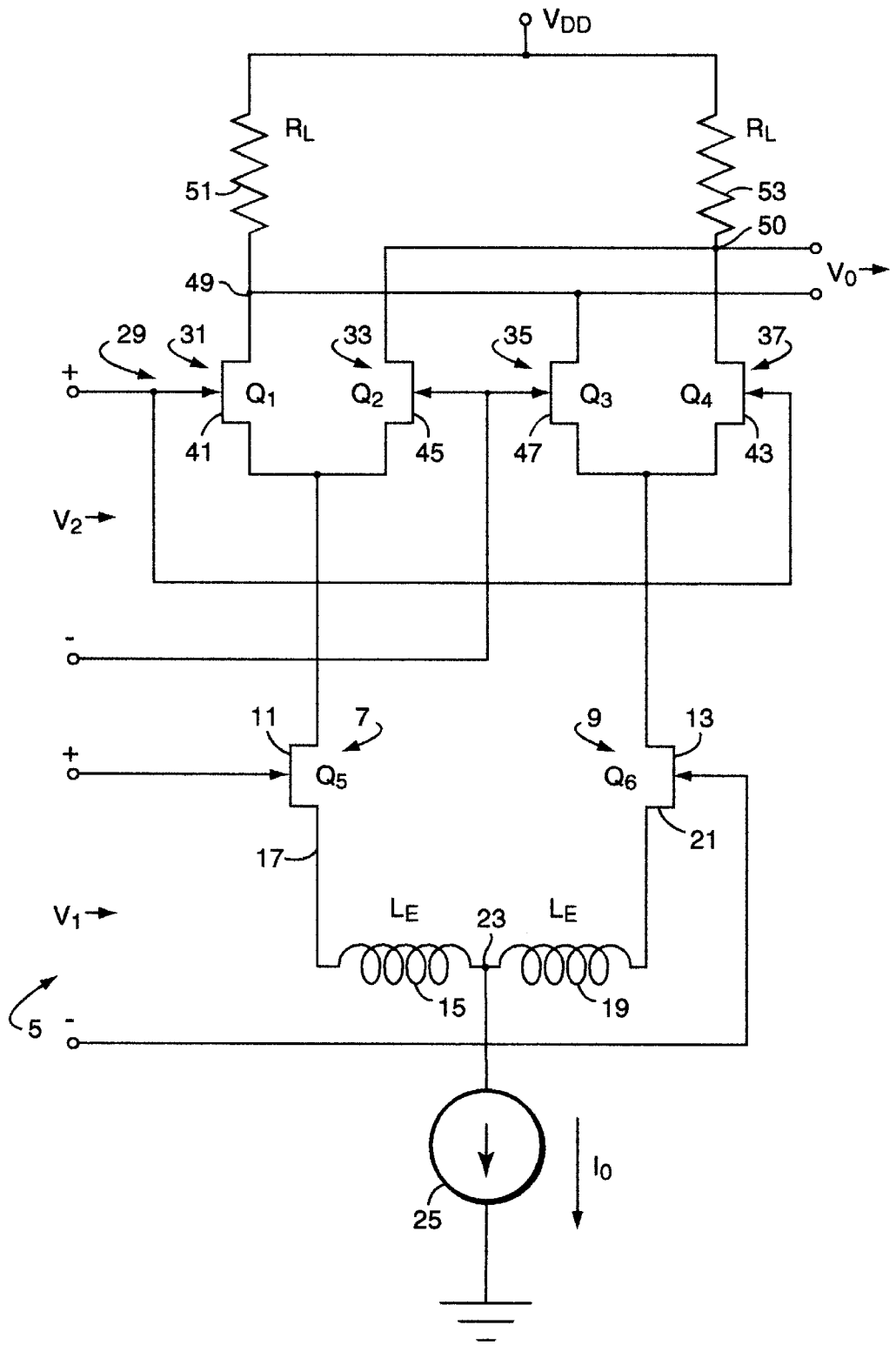
FIG. 1 depicts the circuit of the present invention using degenerative inductors connected to the input transistors of the circuit.

FIG. 1 illustrates a mixer embodying the invention and incorporating field-effect transistors (FETs) each having a drain, a source and a gate electrode. Application of the invention to bipolar transistors having a collector, an emitter, and a base electrode will also be apparent from the following description. The illustrated circuit includes a balanced amplifier having input transistors 7 and 9. An input signal $V_1$ is applied between the gate 11 of input transistor 7 and the gate 13 of transistor 9. The circuit also includes a switch 29 having two transistor pairs consisting of transistors 31, 33 and transistors 35, 37 connected as shown in FIG. 1. An ac signal, $V_2$, produced by a local oscillator (not shown) is applied between gate 41 of transistor 31 and gate 43 of transistor 37 on the one hand, and gate 45 of transistor 33 and gate 47 of transistor 35 on the other hand.

In operation, the local oscillator signal is a high level, constant amplitude ac signal which drives transistors 31 through 37 to operate as synchronous switches. More particularly, with one polarity of the local oscillator signal, transistors 31 and 37 are activated and switching transistor 31 conducts the output from amplifier transistor 7, and switching transistor 37 conducts the output from transistor 9. Conversely, with the opposite polarity of the local oscillator signal, switching transistor 33 is activated to conduct the output of transistor 7, and switching transistor 35 is activated to conduct the output of transistor 9. As the transistor switches 31,33 and 35,37 turn on and off, the signal is thereby periodically inverted and thus multiplied by a square wave at the frequency of the local oscillator. The resulting signal includes the desired output at the intermediate frequency desired in the particular application. The circuit also includes load resistors 51 and 53 connected between a source of supply voltage, $V_{DD}$, and the switch 29. The output of the amplifier is the voltage between node 49 and 50 in FIG. 1.

In operation, transistors 7 and 9 act as amplifiers and operate linearly such that the current at the drain of each transistor is proportional to the gate-source voltage. The transistors 7 and 9 are thus preferably operated in saturation, with the drain current essentially independent of the source-drain voltage.

It is preferable to provide degenerative feedback to maximize the linearity of the input amplifier stage. In accordance with the present invention, an inductor 15 is connected to source 17 of input transistor 7 and an inductor 19 is connected to source 21 of input transistor 9. Inductors 15 and 19 operate as feedback impedances to enhance the linearity of the circuit operation. Conventionally, resistors had been used as the feedback elements. However, as noted herein, the dc voltage drop across the resistors reduces the effective power supply voltage for the transistors of the circuit. In addition, the resistors can generate substantial thermal noise. Inductors 15 and 19, on the other hand, have no dc voltage drop across them, and generate essentially no noise.

Referring again to FIG. 1, the inductors 15 and 19 are connected in common at node 23 to a constant current source 25 which is connected between node 23 and ground. The constant current source 25 functions to maintain the total current 10 in the input portion of the circuit constant. Accordingly, a change in the instantaneous input voltage will result in an equal and opposite change in the currents through transistors 7 and 9 as desired in a balanced mixer configuration.

A performance comparison between the circuit embodying the present invention shown in FIG. 1 and the prior art resistive circuit was performed. In the comparison, the effective value of the degenerative impedance ($Z_E$) of each circuit was made equal at a given RF frequency of 881.65 MHz. The power supply voltage was 3.6 volts. Specifically, the feedback resistance for the resistive circuit was chosen to be 83 ohms and, correspondingly, the inductance of the inductors 15 and 19 was set at 15 nanohenrys. The transistors used were gallium arsenide field effect transistors. The voltage conversion gain of the inventive circuit was 4.4 dB as compared with a conversion gain figure of 2.0 dB for the resistive circuit. The input one dB compression point, which reflects the linearity of the circuit, was 6.0 dBm for the inductive circuit while the resistive circuit showed an input one dB compression point of 3.2 dBm. The noise figure was substantially lower in the inductive circuit, being 10.9 dB, as compared with 13.8 dB in the resistive circuit. From this performance comparison, it will be understood by those skilled in the art that the use of the inductors results in substantially improved performance for the circuit, particularly with the low power supply voltage.

Figure 2:
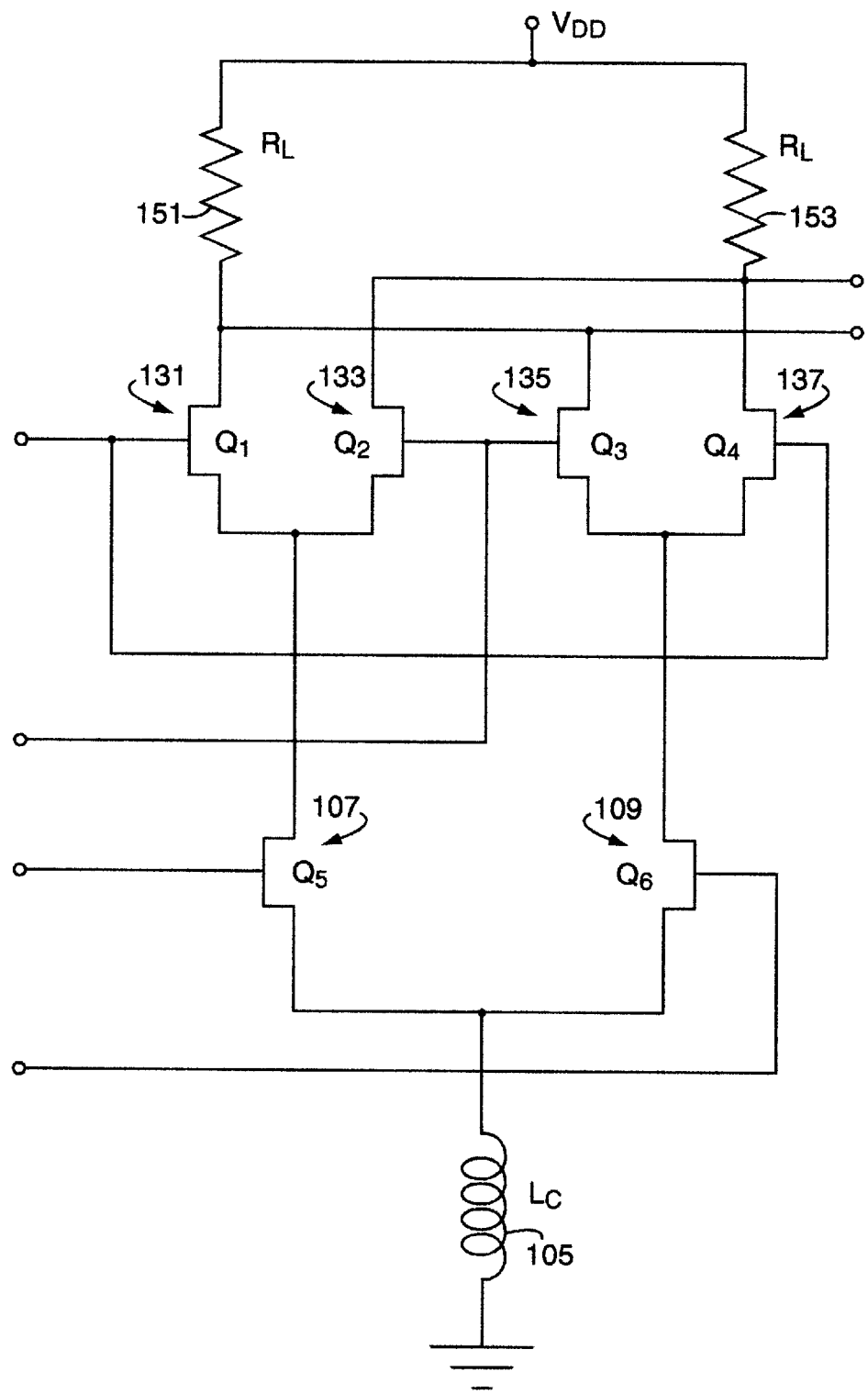
FIG. 2 depicts the circuit of the present invention using an inductor as the constant current source provided at the source of the input transistors.

A circuit embodying another aspect of the invention is shown in FIG. 2. It is similar to the mixer circuit of FIG. 1 in that it includes a balanced amplifier and a switch except that the constant current source is embodied in an inductor 105. Prior art designs have used a transistor (not shown) as a constant current source as discussed above. As noted, the voltage drop across the constant current source transistor reduces the supply voltage available to the input transistors, such as transistors 107 and 109 of FIG. 2, and the switching transistors 131, 133 and 135,137.

The inductor 105, on the other hand, produces essentially no dc voltage drop and, as a result, the full supply voltage can be shared between input transistors 107 and 109, and the transistor pairs in the local oscillator switch of the circuit, specifically, pair 131, 133 and transistor pair 135, 137 as well as load resistors 151 and 153. This further enhances the ability of the input transistors to operate in their saturation regions (i.e., where operation of FETs is linear) in low supply voltage applications.

Figure 3:
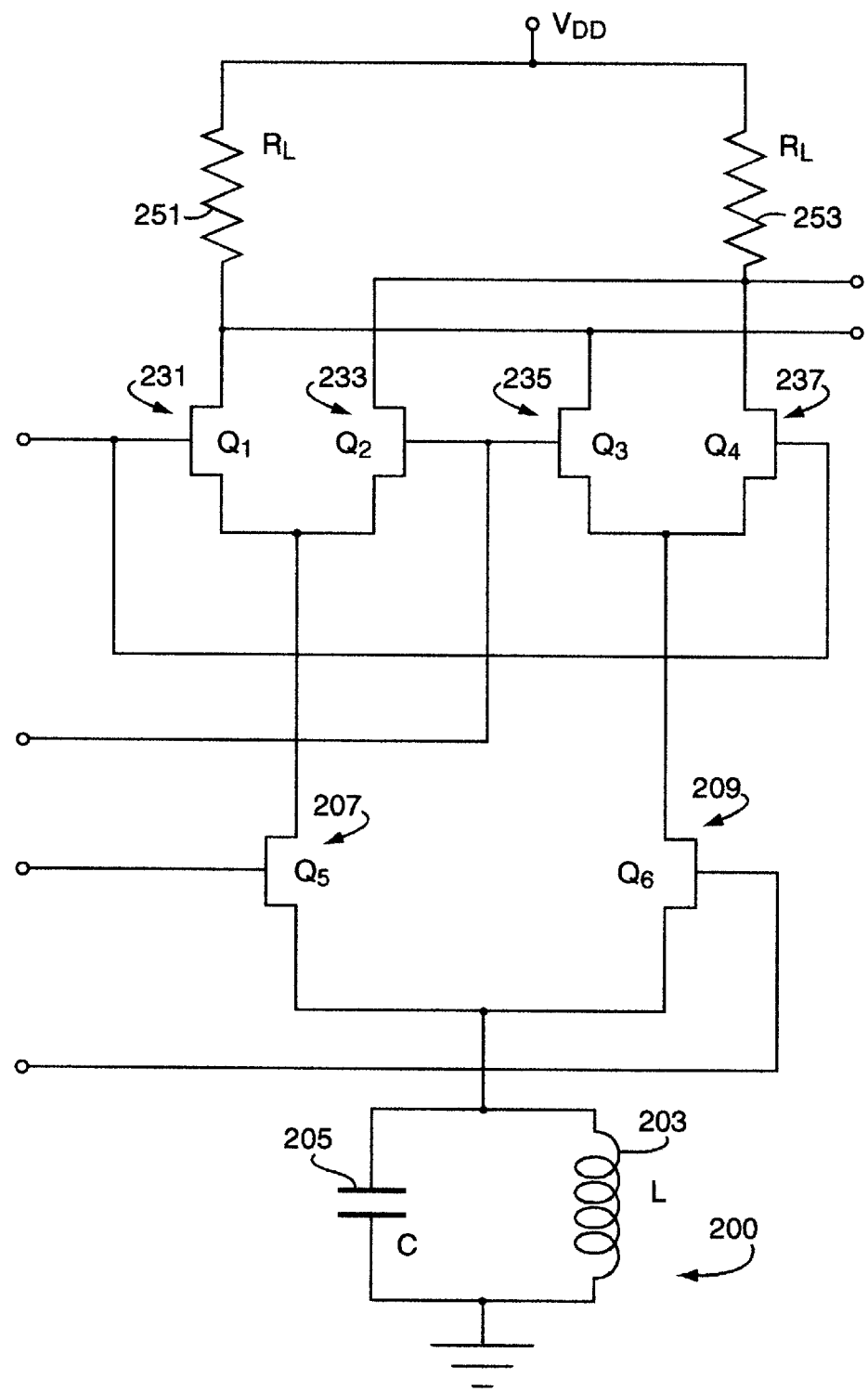
FIG. 3 depicts the circuit of the present invention showing the L-C resonant circuit as the constant current source.

In accordance with yet another aspect of the invention, the circuit may include a parallel LC resonant circuit 200 as the constant current source as shown in FIG. 3. More specifically, inductor 203 is connected in parallel with capacitor 205 to form the LC resonant circuit 200 as shown. It is presently preferred to select the resonant frequency of the LC circuit 200 to be about 50% higher than the required operating frequency for the mixer circuit. Setting the resonant frequency about 1.5 times higher than the operating frequency of the circuit provides safe operation by avoiding abrupt changes in impedance at or near the resonant frequency.

An example of the operation of the circuits of FIGS. 2 and 3 will now be discussed. For the circuit illustrated in FIG. 2, inductor 105 can have a value of 27 nH, and inductor 105 thus has an impedance of 150 ohms at a circuit operating frequency of 880 MHz. A parallel LC circuit 200 can be designed to have the same impedance of 150 ohms at the same operating frequency of 880 Mhz. With a resonant frequency of 1.32 GHz, i.e. 1.5 times the operating frequency (880 MHz), the inductor 203 will have a value of 13 nH and the value of capacitor 205 is 1 pF.

It is also noted that the parallel LC circuit 200 occupies less area on an integrated circuit than a single inductor providing the same impedance. More specifically, a 15 nH rectangular spiral coil in parallel with a 1 pF capacitance, for example, has been found to represent about a 27% area reduction from the area occupied on the integrated circuit by a single 27 nH inductor. As stated herein, use of the parallel LC circuit provides a wide dynamic range for the circuit by allowing that the full power supply voltage will be available for the series combination of the transistors in the balanced amplifier stage of the circuit, the switching transistors and the load resistors in the circuit and this can be accomplished well within the space limitations encountered in integrated circuit technology.

The embodiments of the invention shown in FIGS. 1 through 3 contemplate use of field-effect transistors in the circuits. However, it should be understood by those skilled in the art that the invention is equally applicable to circuits employing bipolar (homo\hetero) junction transistors. In addition, the embodiments illustrated herein include a balanced amplifier, however, it should be understood that the invention may also be used to provide degenerative feedback in a single stage amplifier configuration.

The circuits of the present invention as discussed herein are useful for low supply voltage portable radio transmitters and receivers, such as for example, up/down converters circuits of wireless telephones.

The terms and expressions which have been employed are used as terms of description and not of limitation, and there is no intention, in the use of such terms and expressions, of excluding any equivalents of the features shown and described or portions thereof but it is recognized that whereas particular embodiments of the invention have been described for purposes of illustration, it will be appreciated by those skilled in the art that numerous variations of the details may be made without departing from the invention as described in the appended claims.

What is claimed is:

1. A low-noise mixer circuit for processing a microwave input signal with a local oscillator signal to obtain an output signal having a predetermined intermediate frequency, the circuit comprising:

A. a balanced amplifier receiving said input signal including:
   1) first and second input transistors, each said transistor having a first, second and third electrode with a current from said first electrode to said second electrode being controlled by a signal between said third electrode and said second electrode, with said input signal being applied between the third electrode of said first input transistor and the third electrode of said second input transistor, said balanced amplifier providing a third signal as an output between the first electrode of said first input transistor and the first electrode of said second input transistor,
   2) a first inductance element connected to the second electrode of said first input transistor,
   3) a second inductance element connected to the second electrode of said second input transistor, and
   4) said first and second inductance elements being commonly connected to each other at a node, B. a constant-current source that includes an inductor, said inductor having a first terminal and a second terminal with said first terminal being connected at said node, said constant current source maintaining a constant current in said balanced amplifier, C. switching means for receiving said local oscillator signal, and connected to periodically invert said third signal in response to said local oscillator, and D. a power supply connected to said mixer circuit between load resistor means and the second terminal of said inductor, and said load resistor means being connected to said balanced amplifier through said switching means.

2. The circuit defined in claim 1 wherein said first and second input transistors are transistors selected from the group consisting of MESFETs, MOSFETs and bipolar homo/hetero junction transistors.

3. The circuit defined in claim 2 wherein said first inductance element and said second inductance element are each inductors having a magnitude of about 15 nanohenrys.

4. The circuit defined in claim 1 wherein said constant current source includes:

a capacitor connected in parallel with said inductor to form a parallel inductor-capacitor resonant circuit, and the inductor and capacitor selected such that the resonant frequency of said parallel inductor-capacitor resonant circuit is about fifty percent higher than the operating frequency of said mixer circuit.

5. The circuit defined in claim 1 wherein said power supply provides a voltage of about 3.6 volts or lower.

6. A low-noise mixer circuit for processing an input signal with a local oscillator signal to obtain an output signal having a predetermined intermediate frequency, the circuit comprising:

A. a balanced amplifier including a first and second input MESFET, each said input MESFET having a gate, a source and a drain, and said MESFET being connected to receive said input signal, and said balanced amplifier providing a third signal as an output between the drain of said first input MESFET and the drain of said second input MESFET, B. a constant current source that includes an inductor, said inductor having a first terminal and a second terminal with said first terminal being connected at a node to which the source of said first input MESFET and the source of said second input MESFET are also connected, said constant current source maintaining a constant current in said balanced amplifier, C. switching means receiving said local oscillator signal, and connected to periodically invert said third signal of said balanced amplifier in response to said local oscillator signal, and D. a power supply connected in said mixer circuit between load resistor means and the second terminal of said inductor, and said load resistor means being connected to said balanced amplifier through said switching means.

7. A low noise mixer circuit for processing a microwave input signal with a local oscillator signal to obtain an output signal having a predetermined intermediate frequency, the circuit comprising:

(A) a balanced amplifier including a first and a second input transistor, each said transistor having a first, second and third electrode with a current from said first electrode to said second electrode being controlled by a signal between said third electrode and said second electrode, with said input signal being applied between the third electrode of said first input transistor and the third electrode of said second input transistor, said balanced amplifier providing a third signal as an output between the first electrode of said first input transistor and the first electrode of said second input transistor;

(B) an inductive constant current source means for maintaining a constant total current in said balanced amplifier, said inductive constant current source means being coupled with each of said first and second input transistors;

(C) switching means receiving said local oscillator signal, and connected to periodically invert the output of said balanced amplifier in response to said local oscillator signal; and (D) a power supply connected to said mixer circuit through load resistor means, said load resistor means being connected to said balanced amplifier through said switching means.

8. The mixer circuit defined in claim 7 further including inductor means connected between said second electrodes of said first and second input transistors, thereby to provide degenerative feedback in said balanced amplifier.

* * * * *